(12) United States Patent
Pakravan

(10) Patent No.: US 7,839,637 B2
(45) Date of Patent: Nov. 23, 2010

(54) AIR-COOLING OF ELECTRONICS CARDS

(75) Inventor: Farhad Pakravan, Los Altos, CA (US)

(73) Assignee: Cisco Technology, Inc., San Jose, CA (US)

( * ) Notice: Subject to any disclaimer, the term of this patent is extended or adjusted under 35 U.S.C. 154(b) by 105 days.

(21) Appl. No.: 12/236,549

(22) Filed: Sep. 24, 2008

(65) Prior Publication Data

US 2010/0073872 A1    Mar. 25, 2010

(51) Int. Cl.
*H05K 7/20* (2006.01)
(52) U.S. Cl. .................. 361/695; 361/690; 361/692; 361/694; 165/80.2; 165/122; 454/184
(58) Field of Classification Search .................. None
See application file for complete search history.

(56) References Cited

U.S. PATENT DOCUMENTS

| | | | |
|---|---|---|---|
| 6,459,579 B1 * | 10/2002 | Farmer et al. ............... | 361/695 |
| 7,499,273 B2 * | 3/2009 | Casebolt ................ | 361/679.48 |
| 7,508,663 B2 * | 3/2009 | Coglitore ................... | 361/695 |
| 7,513,923 B1 * | 4/2009 | Lewis et al. ................ | 55/385.6 |
| 2005/0068731 A1 * | 3/2005 | Wei ........................... | 361/695 |
| 2009/0255653 A1 * | 10/2009 | Mills et al. ............. | 165/104.34 |
| 2010/0014248 A1 * | 1/2010 | Boyden et al. .............. | 361/695 |

* cited by examiner

*Primary Examiner*—Boris L Chervinsky
(74) *Attorney, Agent, or Firm*—Patent Capital Group

(57) ABSTRACT

In one embodiment, an apparatus includes a card chamber, an air intake, an airway, an exhaust plenum, and at least one fan. At least one electronics card can be supported in the card chamber. Ambient air from outside the apparatus can flow into the card chamber via the air intake. The airway is located across the card chamber from the air intake. Air flows substantially linearly across the card chamber from the intake to the airway. The exhaust plenum is located adjacent the card chamber and the airway. The fan is operable to draw air from the airway into the exhaust plenum.

15 Claims, 3 Drawing Sheets

AIR-COOLING OF ELECTRONICS CARDS

TECHNICAL FIELD OF THE INVENTION

The present disclosure relates generally to air cooling of electronics cards located in a chassis.

BACKGROUND

Cooling requirements for electronics cards have become more demanding as the electronics cards have ever-increasing power demands. As such, optimum air flow paths over the electronics cards are required for optimum air-cooling of electronics cards. Electronics cards are often housed together in a chassis which provides for the air-cooling of the electronics cards. The air-cooling is achieved by having fans in the chassis draw air over the electronics cards to dissipate the heat from the cards. For effective air-cooling of the electronics cards the flowing air must be evenly distributed over the electronics cards.

A well known configuration for air-cooling of electronics cards supported in a chassis is the "side to back" configuration wherein air is drawn through ventilation openings in the side of the chassis and flows diagonally across the cards to fans in the back of the chassis, from where it exhausts. This configuration may, however, not be the most efficient configuration for air-cooling of electronics cards.

DESCRIPTION OF EXAMPLE EMBODIMENT

Overview

Figure 1:
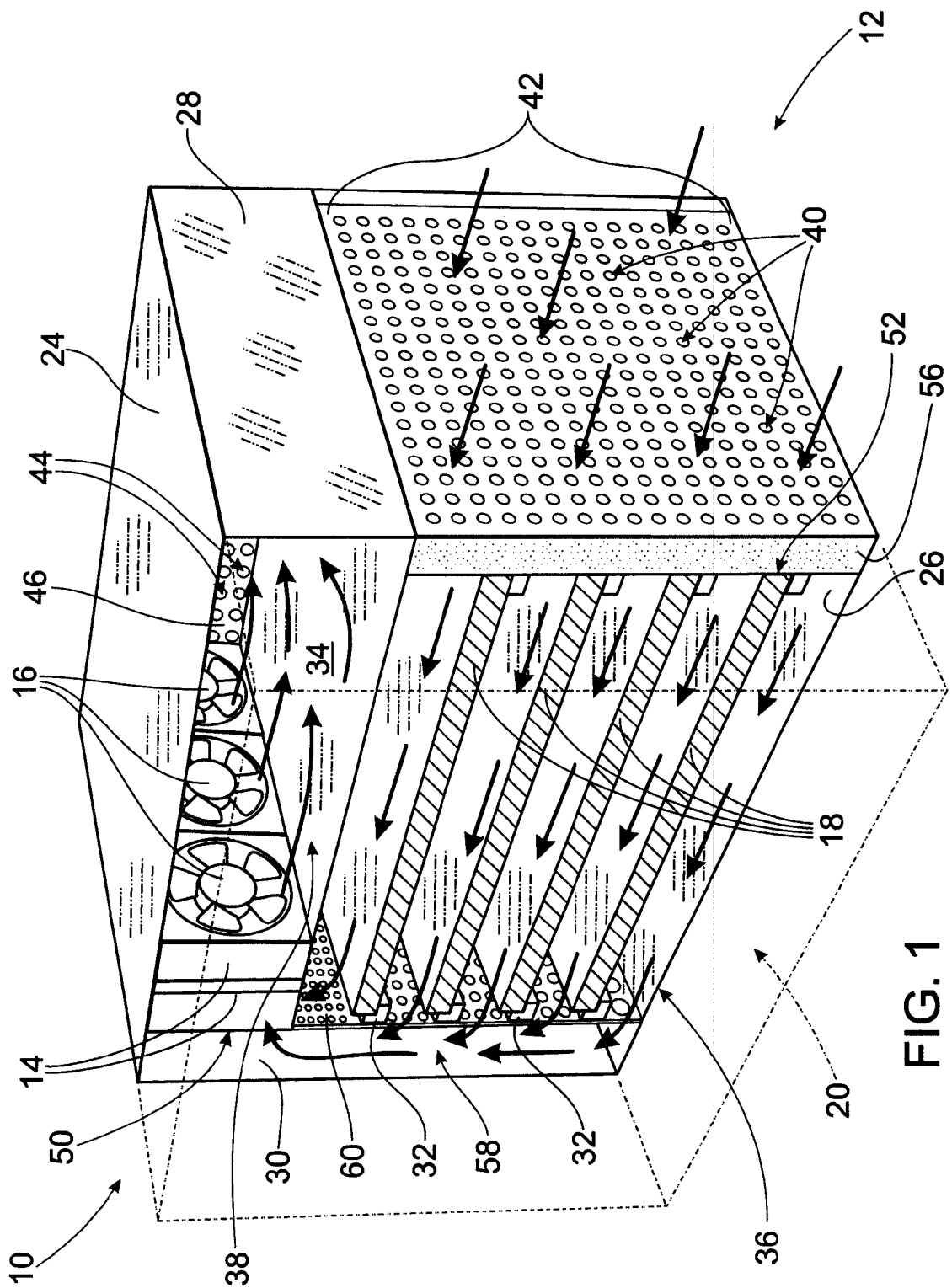
FIG. 1 illustrates a sectional perspective view of an example of an apparatus for air-cooling of electronics cards, including electronics cards supported therein.

In one form, the invention resides in an apparatus comprising: a card chamber for locating at least one electronics card therein; an air intake through which ambient air from outside the apparatus can flow into the card chamber; an airway located across the card chamber from the air intake and into which air can flow substantially linearly across the card chamber; an exhaust plenum located adjacent the card chamber and the airway; and at least one fan operable to draw air from the airway into the exhaust plenum.

In another form, the invention resides in a method comprising: a) creating an area of lower than ambient air pressure in an air airway located across an air intake of a card chamber, so that air can flow substantially linearly across the card chamber; and b) drawing air from the airway into the exhaust plenum in a direction transverse to the flow of air across the card chamber.

Description

An example embodiment of an apparatus in accordance with the invention will now be described with reference to the drawings, wherein like reference numerals are used to refer to like elements throughout.

Referring to FIG. 1, the apparatus 10 is in the form of an electronics card chassis 12. FIG. 1 shows a sectional view of the chassis 12, with broken lines indicating a front section of the chassis 12 which has been truncated so as to better illustrate the flow of air through the chassis 12.

In the drawings, arrows indicate the flow path of air through the chassis 12. Heat generated by the electronics cards 18 gets dissipated by the air which flows across the electronics cards 18 to cool the cards.

The chassis 12 is generally box-shaped. The chassis 12 has a front end 20 (truncated), a back panel 22 (only shown in FIGS. 2 and 3), a top panel 24, a bottom panel 26, and first and second spaced-apart parallel sidewalls 28,30, respectively.

The chassis 12 is divided into a card chamber 36 and an exhaust plenum 38 by a common boundary wall 34 and includes an airway 58 which extends between the card chamber 36 and the exhaust plenum 38. The boundary wall 34 extends lengthwise from the front end 20 to the back panel of the chassis 12 and along its width from the first sidewall 28 and terminates spaced from the second sidewall 30. The card chamber 36 and the exhaust plenum 38 are adjacent to the airway 58 and open to the airway 58.

The exhaust plenum 38 is open to the airway 58 at an opening 50 through which air in airway 58 flows into the exhaust plenum 38. The chassis 12 includes two fan trays 14 of extraction fans 16 mounted therein for creating an area of lower than ambient air pressure in the airway 58 so that air flows linearly across the card chamber 36 as indicated by the arrows. The two fan trays 14 of extraction fans 16 are located one behind the other in the opening 50. The area of lower than ambient air pressure in the airway 58 may alternatively be created by a suction pump.

Support formations 32 are located in the card chamber 36 for locating the electronics cards 18 in the chassis 12. An air flow balancing plate 60 is located against the support formations 32 closest to the sidewall 30. The air flow balancing plate 60 is described in more detail with reference to FIG. 4 of the drawings.

A lower part of the airway 58 is defined between the second sidewall 30 and the air flow balancing plate 60. An upper part of the airway 58 is defined between the fan trays 14 and the second sidewall 30. In use, the area of lower than ambient air pressure is created in the airway 58. The airway 58 extends transverse to the flow of air across the card chamber 36.

The front end 20 of the chassis 12 has an opening (not shown due to truncation) through which the electronics cards 18 are introduced into the card chamber 36 of the chassis 12. The electronics cards 18 have flanges at their front ends (not shown) which, when the electronics cards 18 located in the chamber 36, together closes off the opening in the front end 20 of the chassis 12. Should there not be an adequate number of electronics cards 18 in the chassis 12, dummy cards are inserted to close off the opening in the front end 20. It is important that the opening in the front end 20 to be closed off as airflow into the chassis 12 should only occur from the side of the chassis in order to achieve optimum cooling of the electronics cards 18. Dummy cards also help ensure that there is even balance of air flow between the electronics cards 18 as the air flow paths between the cards 18 are similar.

An air intake in the form of air intake openings 40 are defined in a section 42 of the first sidewall 28. The section 42 defines a wall of the card chamber 36. Exhaust openings 44 are defined in a section 46 of the back panel 22. The section 46 defines a wall of the exhaust plenum 38.

Figure 2:
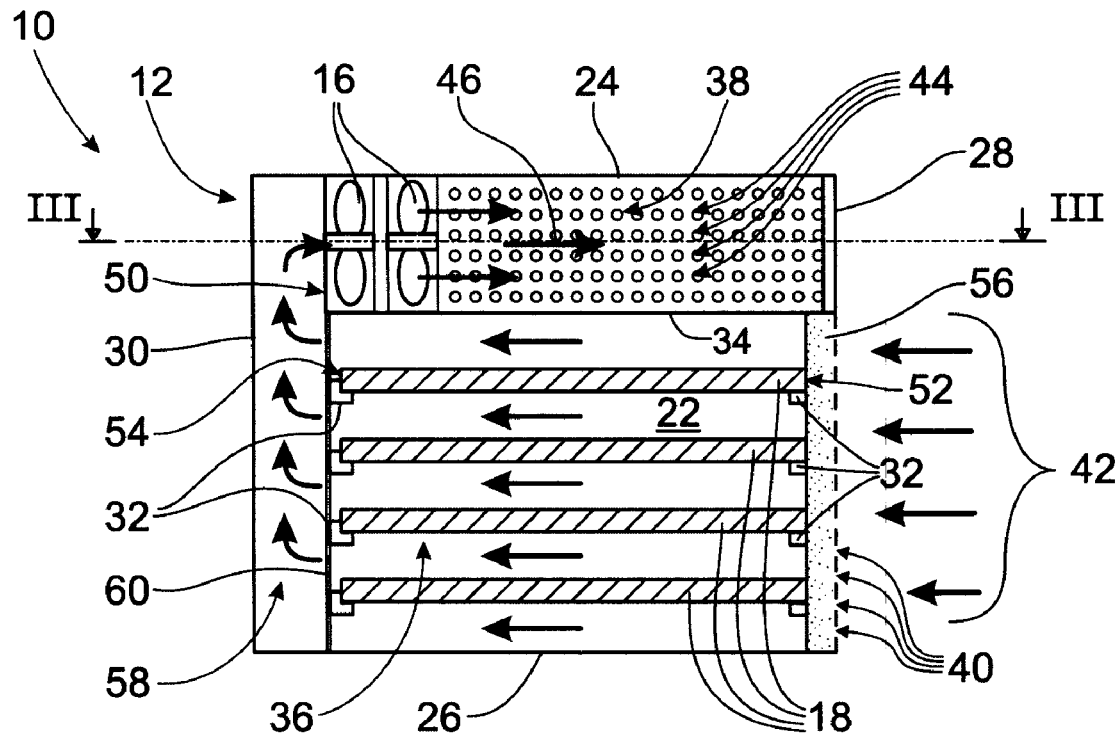
FIG. 2 illustrates a sectional front view of the apparatus of FIG. 1.

Referring to FIG. 2 of the drawings, the electronics cards 18 are shown supported parallel to each other in the card chamber 36. The electronics cards 18 are rectangular in top view and generally planar. The electronics cards 18 are supported one above the other. Each electronics card 18 has a first lateral side 52 and a second lateral side 54. The electronics cards 18 may be any type of printed circuit boards including line cards, rout processors and the like. In one embodiment the electronics cards 18 are of the type that uses more than 500 Watts of power. The electronics cards 18 are supported in the chassis 12 in a configuration wherein the lateral sides 52, 54 are seated on the support formations 32. The first lateral side 52 of each electronics card 18 is adjacent the air intake openings 40. An air filter 56 is located against the section 42 of the first sidewall 28. The air filter 56 fits between the section 42 and the first lateral sides 52 of the electronics cards 18. The second lateral sides 54 of the electronics cards 18 are supported by the support formations 32 at a position spaced from the second sidewall 30.

Figure 3:
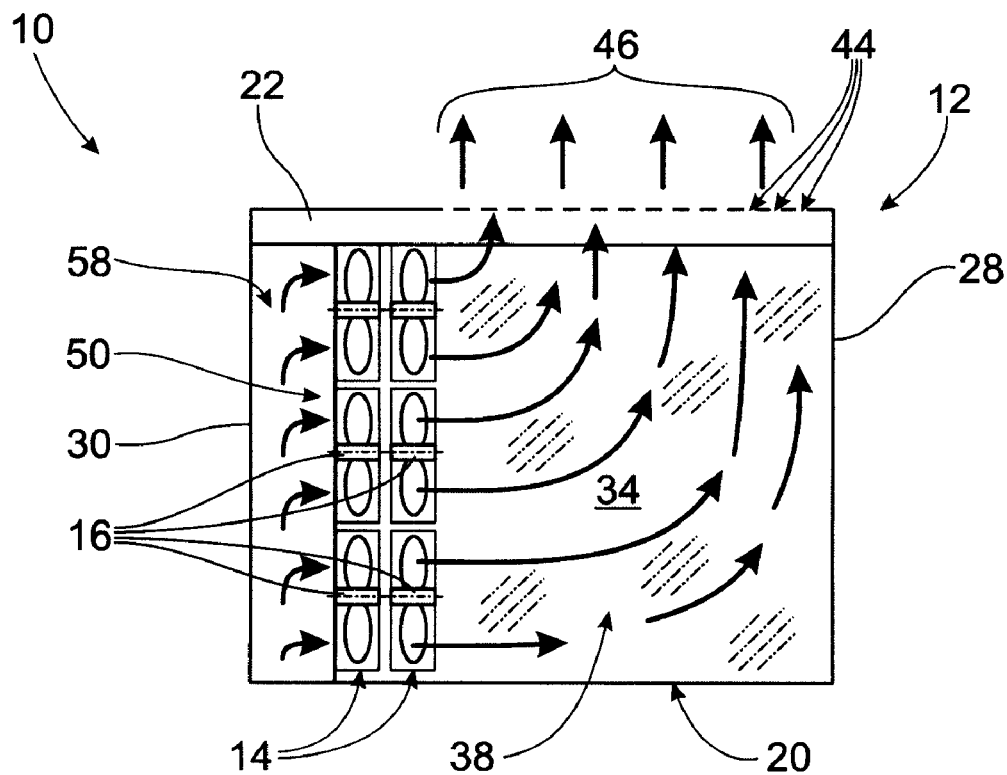
FIG. 3 illustrates a sectional top view of the apparatus of FIG. 1, sectioned along section line III-III of FIG. 2.

Referring to FIG. 3 of the drawings, the fans 16 are in air flow communication with the airway 58 and the exhaust plenum 38. The fans 16 are operable to create an area of lower than ambient air pressure in the airway 58. The fans 16 draw air from the airway 58 into the exhaust plenum 38. The fans 16 also over-pressurize the exhaust plenum 38 so that the air in the exhaust plenum 38 is exhausted through the exhaust openings 44 in the section 46 of the back panel 22.

Figure 4:
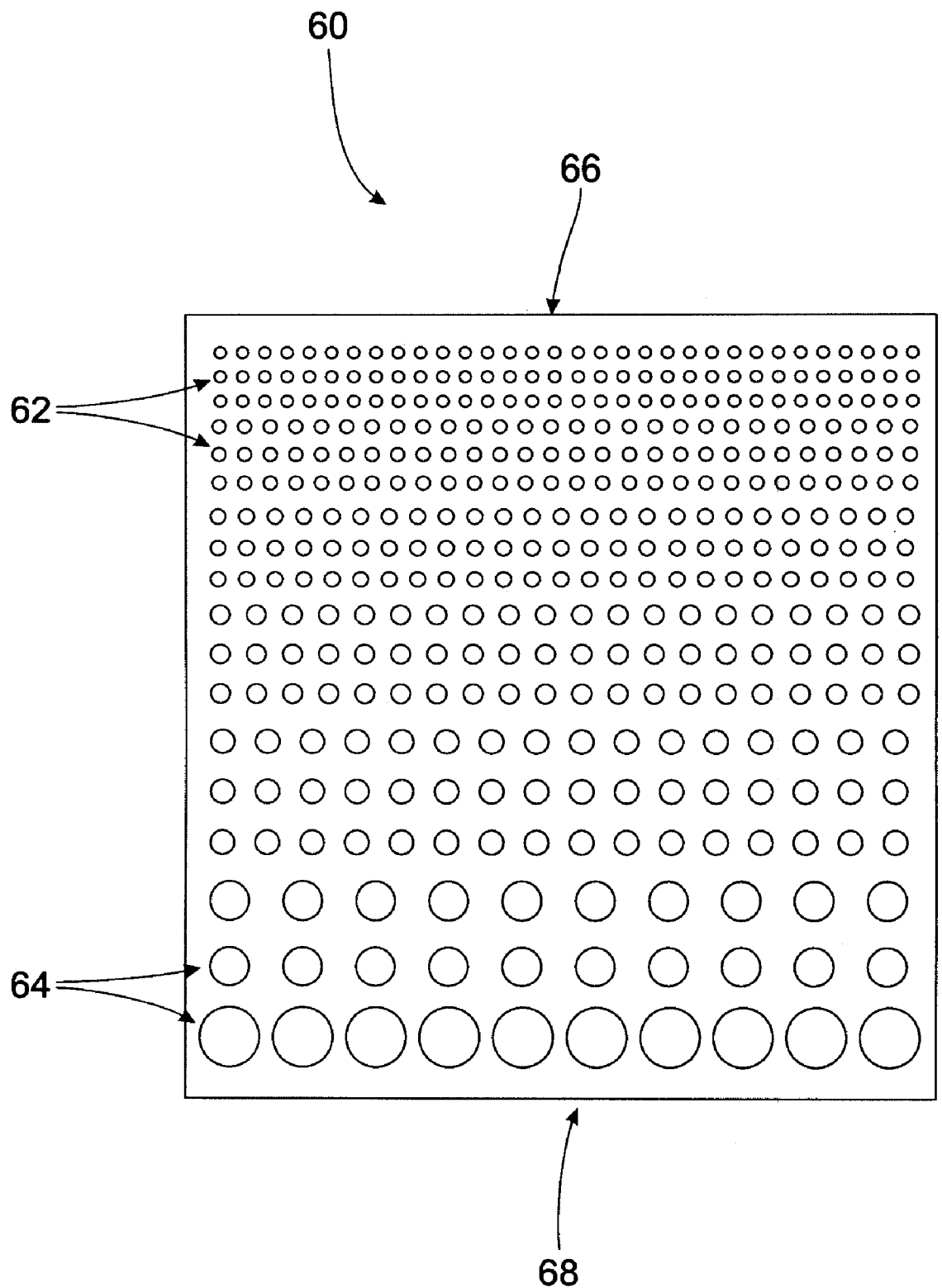
FIG. 4 illustrates a plan view of an air flow distribution plate of the apparatus of FIG. 1.

With reference to FIG. 4 of the drawings, the air flow balancing plate 60 has an upper end 66 and a lower end 68. The upper end 66 abuts the boundary wall 34 and the lower end 68 abuts the bottom panel 26 of the chassis 12. The air flow balancing plate 60 forms a barrier for air which flows from the air intake openings 40 to the airway 58. The air flow balancing plate 60 has air flow balancing formations in the form of holes 62, 64 defined therein. The holes 62 higher up in the air flow balancing plate 60 are smaller in diameter than the holes 64 which are lower down in the plate 60. As such, air which flows through holes 62 higher up in the air flow balancing plate 60 are more restricted in flow than the air which flows through the holes 64 lower down in the air flow balancing plate 60. The pressure profile of the lower than ambient air pressure in the airway 58 is biased in that the lowest air pressure in the airway 58 is closest to the fan trays 14 and the pressure differential between the ambient air pressure and the air pressure in the airway 58 becomes progressively less toward to the bottom panel 26 of the chassis 12. The air flow balancing plate 60 is the inverse of the pressure profile in the airway 58 in that air flow is progressively less restricted from its upper end 66 to its lower end 66 at the bottom panel 26 of the chassis 12. This inverse relationship has the effect of evenly balancing the flow of air of the electronics cards 18. The volume and rate of flow of air over the topmost electronics card 18 is substantially the same as the volume and rate of flow of air over the bottom most electronics card 18.

Similarly, the Applicant envisages that air flow may also be balanced by an air flow balancing plate which is similar to the air flow balancing plate 60 described hereinabove, but which substitutes for the part 42 of the sidewall 28 and which works in the same manner to evenly balance air flow over the electronics cards 18 as described for the air flow balancing plate 60.

With reference to FIGS. 1 to 3 of the drawings, the sequence of flow of air through the chassis 10 when the fans 16 are operating is as follows:

a) Air from outside the chassis 12 enters the electronics card chamber 36 of the chassis 12 through the air intake openings 40 defined in the part 42 of the sidewall 28.

b) The air passes through the air filter 56 and to the first lateral sides 52 of the electronics cards 18.

c) The air flows linearly across the electronics cards 18 form their first lateral sides 52 to their second lateral sides 54. The heat radiating from the electronics cards 18 is dissipated as the air flows across the electronics cards 18.

d) The air is drawn through the holes, such as holes 62 and 64. in the air flow balancing plate 60 into the area of lower than ambient air pressure in the airway 58.

e) The air from the airway 58 is drawn in a direction transverse to the flow of air across the card chamber 36, and into the exhaust plenum 38 via the opening 50.

f) The air exhausts from the exhaust plenum 38 via the exhaust openings 44 defined in the section 46 of the back panel 22.

Air which flows through the chassis 12 from the air intake openings 40 to the exhaust openings 44 thus flows linearly across the card chamber 36, between the lateral sides 52,54 of the electronics cards 18. The air flow is distributed evenly over the top and bottom of the electronics cards 18.

The layout of the apparatus 10 provides for enhanced airflow over the electronics cards 18 as opposed to that provide by standard "side to back" airflow designs. The airflow is evenly balanced between the electronics cards 18 and distributed evenly between the front and the back of each electronics card 18. The enhanced airflow allows for electronics cards 18 with higher power usage, and thus higher cooling requirements, to be used in the chassis 12 than would have been the case if "side to back" airflow was used.

The invention claimed is:

1. An apparatus comprising:
   a square shaped chassis;
   a card chamber for locating at least one electronics card therein;
   an air intake through which ambient air from outside the apparatus can flow into the card chamber;
   an airway located across the card chamber from the air intake and into which air can flow substantially linearly across the card chamber;
   an exhaust plenum located adjacent the card chamber and the airway;
   a plurality of fans operable to draw air from the airway laterally across the card chamber and into the exhaust plenum, which is positioned to direct the air laterally to a set of exhaust openings in a back panel of the apparatus, wherein the fans are coplanar with the exhaust plenum and the exhaust openings;
   an air filter positioned in the card chamber and abutting a first sidewall; and
   an air flow balancing plate having an upper end and a lower end, wherein the airflow balancing plate includes progressively larger holes that extend down the airflow balancing plate.

2. The apparatus of claim 1, wherein the card chamber and the exhaust plenum are separated by a common boundary wall.

3. The apparatus of claim 1, wherein the electronics card has opposite sides which are located adjacent the air intake and the airway, respectively, and the airway and exhaust plenum are open to each other at an opening which is spaced further away from the air intake than the width dimension between the opposite sides of the electronics card.

4. The apparatus of claim 1, wherein the fan is located in the exhaust plenum.

5. The apparatus of claim 4, wherein the fan is located in the exhaust plenum at an opening between the exhaust plenum and the airway.

6. The apparatus of claim 1, wherein the airway extends transverse to the flow of air across the card chamber.

7. The apparatus of claim 1, which includes support formations for locating the electronics card in a position between the air intake and the airway.

8. The apparatus of claim 7, wherein the support formations are arranged to locate a number of electronics cards spaced parallel to each other in the card chamber.

9. The apparatus of claim 8, which includes air flow balancing formations which balance the air flow evenly across the respective electronics cards.

10. The apparatus of claim 1, wherein the apparatus is generally box-shaped, having:
 a front end;
 a back panel;
 a top panel;
 a bottom panel;
 first and second spaced apart parallel sidewalls which extend between the front end and the back panel, the first sidewall having the air intake defined therein;
 a common boundary wall between the card chamber and the exhaust plenum; and
 support formations in the card chamber for locating the electronics card, wherein the support formations closest to the second sidewall is suitably spaced from the second sidewall to define the airway between the second sidewall and the support formations closest thereto.

11. The apparatus of claim 1, which includes a number of support formations in the card chamber for supporting a number of electronics cards spaced parallel to each other and wherein the air intake includes a number of air intake openings defined in the first sidewall.

12. An apparatus comprising:
 a card chamber for locating at least one electronics card therein;
 an air intake through which ambient air from outside the apparatus can flow into the card chamber;
 an airway located across the card chamber from the air intake and into which air can flow substantially linearly across the card chamber;
 an exhaust plenum located adjacent the card chamber and the airway;
 a plurality of fans operable to draw air from the airway laterally across the card chamber and into the exhaust plenum, which is positioned to direct the air laterally to a set of exhaust openings in a back panel of the apparatus, wherein the fans are coplanar with the exhaust plenum and the exhaust openings;
 an air filter positioned in the card chamber and abutting a first sidewall; and
 an air flow balancing plate having an upper end and a lower end, wherein the airflow balancing plate includes progressively larger holes that extend down the airflow balancing plate.

13. The apparatus of claim 12, wherein the apparatus is an integral box-shaped chassis, having:
 a front end;
 a back panel;
 a top panel;
 a bottom panel;
 first and second spaced apart parallel sidewalls which extend between the front end and the back panel, the first sidewall having the air intake defined therein;
 a common boundary wall between the card chamber and the exhaust plenum; and
 support formations in the card chamber for locating the electronics card, wherein the support formations closest to the second sidewall is suitably spaced from the second sidewall to define the airway between the second sidewall and the support formations closest thereto.

14. The apparatus of claim 13, wherein the support formations are arranged to locate a number of electronics cards spaced parallel to each other in the card chamber, and wherein air flow balancing formations balance the air flow evenly across the respective electronics cards.

15. The apparatus of claim 12, which includes support formations for supporting a number of electronics cards parallel to each other in the card chamber and air flow balancing means for evenly balancing the airflow across the respective electronics cards.

* * * * *